(12) United States Patent
Wasyluk et al.

(10) Patent No.: US 9,184,260 B2
(45) Date of Patent: Nov. 10, 2015

(54) METHODS FOR FABRICATING INTEGRATED CIRCUITS WITH ROBUST GATE ELECTRODE STRUCTURE PROTECTION

(71) Applicant: GLOBALFOUNDRIES, Inc., Grand Cayman (KY)

(72) Inventors: Joanna Wasyluk, Dresden (DE); Dominic Thurmer, Dresden (DE); Ardechir Pakfar, Dresden (DE); Markus Lenski, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/080,558

(22) Filed: Nov. 14, 2013

(65) Prior Publication Data

US 2015/0132914 A1    May 14, 2015

(51) Int. Cl.
*H01L 21/425* (2006.01)
*H01L 21/8238* (2006.01)
*H01L 21/336* (2006.01)
*H01L 29/66* (2006.01)
*H01L 29/51* (2006.01)
*H01L 29/165* (2006.01)

(52) U.S. Cl.
CPC .......... *H01L 29/6656* (2013.01); *H01L 29/517* (2013.01); *H01L 29/6659* (2013.01); *H01L 29/66628* (2013.01); *H01L 29/66636* (2013.01); *H01L 29/165* (2013.01); *H01L 29/665* (2013.01)

(58) Field of Classification Search
None
See application file for complete search history.

(56) References Cited

U.S. PATENT DOCUMENTS

| | | | |
|---|---|---|---|
| 5,780,364 A * | 7/1998 | Thakur | 438/775 |
| 2003/0124809 A1 * | 7/2003 | Lee | 438/305 |
| 2005/0121733 A1 * | 6/2005 | Chen et al. | 257/408 |
| 2005/0227446 A1 * | 10/2005 | Kao et al. | 438/305 |
| 2006/0189066 A1 * | 8/2006 | Hornung et al. | 438/229 |
| 2006/0292762 A1 * | 12/2006 | Borland et al. | 438/151 |
| 2007/0045688 A1 * | 3/2007 | Sashida | 257/295 |
| 2008/0073676 A1 * | 3/2008 | Takeoka | 257/288 |
| 2008/0124861 A1 * | 5/2008 | Lin et al. | 438/232 |
| 2008/0153273 A1 * | 6/2008 | Kirmse et al. | 438/514 |
| 2010/0065910 A1 * | 3/2010 | Takeoka | 257/344 |

* cited by examiner

*Primary Examiner* — Kimberly Rizkallah
*Assistant Examiner* — Brian Turner
(74) *Attorney, Agent, or Firm* — Ingrassia Fisher & Lorenz, P.C.

(57) ABSTRACT

Methods for fabricating an integrated circuit are provided herein. In an embodiment, a method for fabricating an integrated circuit includes forming a gate electrode structure overlying a semiconductor substrate. First sidewall spacers are formed adjacent to sidewalls of the gate electrode structure, and the first sidewall spacers include a nitride. An oxide etchant is applied to a surface of the semiconductor substrate after forming the first sidewall spacers. A second spacer material that includes a nitride is deposited over the semiconductor substrate and the first sidewall spacers to form a second spacer layer after applying the oxide etchant to the surface of the semiconductor substrate. The second spacer layer is etched with a second spacer etchant to form second sidewall spacers.

18 Claims, 3 Drawing Sheets

_US 9,184,260 B2_

METHODS FOR FABRICATING INTEGRATED CIRCUITS WITH ROBUST GATE ELECTRODE STRUCTURE PROTECTION

TECHNICAL FIELD

The technical field generally relates to methods for fabricating integrated circuits, and more particularly relates to methods for fabricating integrated circuits with robust protection of gate electrode structures within the integrated circuits.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel of a semiconductor substrate under the influence of a bias applied to a gate electrode that overlies the channel. The gate electrode is disposed on a gate dielectric and generally includes a high-k dielectric material, i.e., a material that has a dielectric constant that is greater than silicon (dielectric constant of 3.9). The gate dielectric is disposed between the gate electrode and the semiconductor substrate, and the gate electrode and the gate dielectric together form a gate electrode structure. The ICs are usually formed using both P-channel FETs (PMOS transistors or PFETs) and N-channel FETs (NMOS transistors or NFETs) and the IC is then referred to as a complementary MOS or CMOS circuit. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

As advanced MOS technology continues to scale and move into the deep-sub-micron geometry dimensions, proper protection of gate electrode structures becomes more complex. Protection of the gate electrode structures is generally achieved by forming sidewall spacers adjacent to sidewalls of the gate electrode structures prior to implantation techniques that are employed to form the source and drain regions in the semiconductor substrate. Protection of the gate electrode structures using the sidewall spacers is generally desired to mask the gate electrode structures from various front-end-of-line (FEOL) processing techniques that could degrade the gate electrode structures, particularly techniques that employ etchants. The spacers also enable self-aligned formation of the source and drain regions during ion implantation. If the gate electrode structure is not properly protected, the gate electrode structure may be compromised during further FEOL processing. Often poor adhesion between the sidewall spacers and the semiconductor substrate is observed, resulting in formation of a seam between the sidewall spacers and the gate electrode structure. High-k dielectric material in the gate dielectric may be susceptible to etching through the seam during various cleaning techniques that are employed during FEOL processing, resulting in so-called "missing high k" defects that degrade yield performance of the ICs.

Accordingly, it is desirable to provide methods of forming semiconductor devices with robust protection of the gate electrode structures, with the high-k dielectric layer of the gate electrode structures adequately protected from etching during FEOL processing. Furthermore, other desirable features and characteristics of the present invention will become apparent from the subsequent detailed description of the invention and the appended claims, taken in conjunction with the accompanying drawings and this background of the invention.

BRIEF SUMMARY

Methods for fabricating an integrated circuit are provided herein. In an embodiment, a method for fabricating an integrated circuit includes forming a gate electrode structure overlying a semiconductor substrate. First sidewall spacers are formed adjacent to sidewalls of the gate electrode structure, and the first sidewall spacers include a nitride. An oxide etchant is applied to a surface of the semiconductor substrate after forming the first sidewall spacers. A second spacer material including a nitride is deposited over the semiconductor substrate and the first sidewall spacers to form a second spacer layer after applying the oxide etchant to the surface of the semiconductor substrate. The second spacer layer is etched with a second spacer etchant to form second sidewall spacers.

In another embodiment, a method for fabricating an integrated circuit includes forming a gate electrode structure overlying a semiconductor substrate. A first spacer-forming material is deposited over the gate electrode structure and the semiconductor substrate to form a first spacer layer. The first spacer layer is etched with a first spacer etchant through a dry etching technique to form first sidewall spacers. A surface of the semiconductor substrate is oxidized during etching to form a thin oxide layer on the surface of the semiconductor substrate after etching. The thin oxide layer is removed from the surface of the semiconductor substrate after forming the first sidewall spacers. A second spacer material including a nitride is deposited over the semiconductor substrate and the first sidewall spacers to form a nitride spacer layer after removing the thin oxide layer from the surface of the semiconductor substrate. The second spacer layer is etched with a second spacer etchant to form second sidewall spacers.

In another embodiment, a method for fabricating an integrated circuit includes depositing a high-k dielectric material over a semiconductor substrate to form a high-k dielectric layer. A gate material is deposited over the high-k dielectric layer to form a gate semiconductor layer overlying the high-k dielectric layer. The gate semiconductor layer and the high-k dielectric layer are patterned to form a gate electrode structure. A first spacer-forming material is deposited over the gate electrode structure and semiconductor substrate to form a first spacer layer. The first spacer layer is etched through a dry etching technique with a first spacer etchant to form first sidewall spacers. A source extension region and a drain extension region are formed in the semiconductor substrate for the gate electrode structure after forming the first sidewall spacers. An oxide etchant is applied to a surface of the semiconductor substrate after forming the source extension region and the drain extension region. A second spacer material including a nitride is deposited over the semiconductor substrate and the first sidewall spacers after applying the oxide etchant to the surface of the semiconductor substrate to form a second spacer layer. The second spacer layer is etched with a second spacer etchant to form second sidewall spacers. A source region and a drain region are formed in the semiconductor substrate for the gate electrode structure after forming the second sidewall spacers.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof Furthermore, there is no intention to be bound by any theory presented in the preceding background or the following detailed description.

Methods for fabricating integrated circuits are provided herein. In particular, the integrated circuits formed in accordance with the methods that are described herein include a semiconductor substrate, a source region and a drain region disposed in the semiconductor substrate, a channel region defined between the source region and the drain region in the semiconductor substrate, and a gate electrode structure that includes a high-k gate dielectric layer and a gate electrode overlying the high-k gate dielectric layer. First sidewall spacers are disposed adjacent to sidewalls of the gate electrode structure, and the first sidewall spacers include a nitride. Second sidewall spacers that also include a nitride are disposed adjacent to the first sidewall spacers. Without being bound by any particular theory, it is believed that during formation of the first sidewall spacers by anisotropic etching, unwanted oxidation of the surface of the semiconductor substrate occurs, and poor adhesion between the second sidewall spacers and the semiconductor substrate is attributable to the oxidation of the surface of the semiconductor substrate over which the second sidewall spacers are formed. Oxidation of the surface of the semiconductor substrate may also be caused through other mechanisms, such as by exposure to atmospheric oxidizing agents between processing stages. To maximize adhesion between the semiconductor substrate and the second sidewall spacers, any oxides that may form on the surface of the semiconductor substrate are removed, such as by applying an oxide etchant to the surface of the semiconductor substrate, prior to forming the second sidewall spacers and after forming the first sidewall spacers. As a result of the maximized adhesion, robust protection of the gate electrode structure is achieved, with the high-k dielectric layer of the gate electrode structures adequately protected from etching during further FEOL processing.

Various steps in the manufacture of MOS components are well known and so, in the interest of brevity, many conventional steps will only be mentioned briefly herein or will be omitted entirely without providing the well-known process details. As used herein, the term "MOS transistor" properly refers to a device having a gate electrode formed of a metal-containing material and an oxide gate insulator, although it is understood that the term may also be used to refer to any semiconductor device that includes a conductive gate electrode (whether metal or other conductive material) that is positioned over a gate insulator (whether oxide or other insulator) which, in turn, is positioned over a semiconductor substrate.

Figure 1:
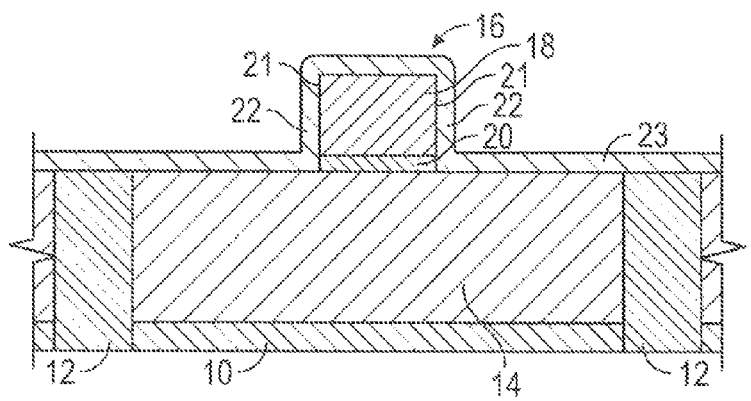
FIGS. 1-7 illustrate, in cross section, a method for fabricating a portion of an integrated circuit in accordance with an exemplary embodiment.

An exemplary method of forming a semiconductor device will now be described with reference to FIGS. 1-7. Referring to FIG. 1, a semiconductor substrate 10 provided. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or, as illustrated, may be a thin layer of silicon on an insulating layer (commonly known as silicon-on-insulator or SOI) that, in turn, is supported by a carrier wafer.

In an embodiment and as shown in FIG. 1, shallow trench isolation (STI) structures 12 are formed in the semiconductor substrate 10, and wells 14 are formed in the semiconductor substrate 10 through conventional fabrication techniques. The wells 14 have a dopant concentration, or a concentration of conductivity determining ions, and the conductivity determining ions may be a P-type or N-type conductivity determining ions, depending upon whether a PMOS transistor or NMOS transistor is to be formed. Each well 14 contains opposite conductivity determining ions from the source region and drain region that are to be formed therein. For example, when the source region and drain region for a device include P-type conductivity determining ions, the well 14 includes N-type conductivity determining ions, and vice versa. Typical N-type conductivity determining ions include, but are not limited to, phosphorus, arsenic, antimony, and combinations thereof. Typical P-type conductivity determining ions include, but are not limited to, boron, aluminum, gallium, indium, and combinations thereof In an embodiment and as also shown in FIG. 1, a gate electrode structure 16 is formed overlying the semiconductor substrate 10. Although not shown in the Figures, a plurality of gate electrode structures 16 are generally formed overlying the semiconductor substrate 10. However, for illustrative purposes, FIGS. 1-7 show a single gate electrode structure 16. As shown in FIG. 1, the gate electrode structure 16 includes a gate electrode 18 that overlies a high-k gate dielectric layer 20. The gate electrode structure 16 may be part of a metal-oxide-semiconductor (MOS) transistor device that is formed on and within the semiconductor substrate 10. In an embodiment, the methods described herein are particularly applicable to forming P-type devices, i.e., P-type MOS devices. P-type devices may be more prone to poor protection of the gate electrode structure 16 than N-type devices due to the P-type devices being exposed to more etching and cleaning steps due to source and drain formation than N-type devices. Thus, P-type devices may benefit from the methods described herein more than N-type devices.

The high-k gate dielectric layer 20 includes a high-k material. As referred to herein, "high-k material", or high dielectric constant material, is a material that has a dielectric constant that is greater than silicon (dielectric constant of 3.9). Examples of suitable high-k dielectric materials include, but are not limited to, hafnium oxide, lanthanum oxide, zirconium oxide, tungsten oxide, iridium oxide, aluminum oxide, and the like. The gate electrode 18 may include conventional gate materials including copper, silver, and doped or undoped polycrystalline silicon. The gate electrode structure 16 may be formed through conventional techniques. For example, in embodiments, the high-k dielectric material is deposited over the semiconductor substrate 10 to form a high-k dielectric layer, followed by depositing the gate material over the high-k dielectric layer to form a gate semiconductor layer that overlies the high-k dielectric layer. The gate semiconductor layer and the high-k dielectric layer are then patterned through conventional techniques to form the gate electrode structure 16.

Figure 2:
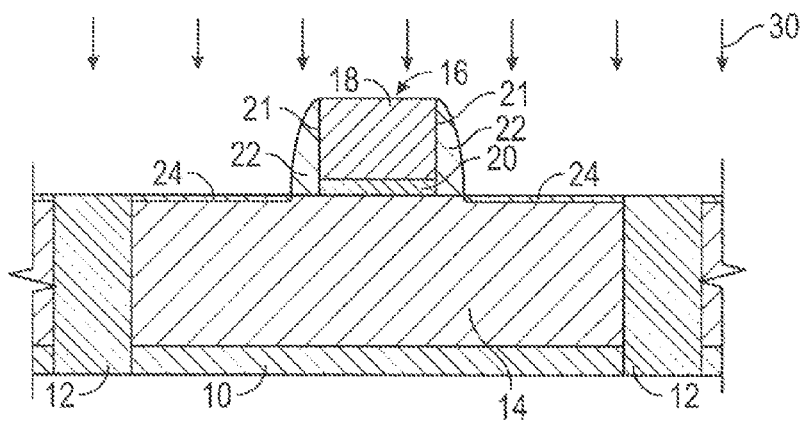

Referring momentarily to FIG. 2, first sidewall spacers 22 are formed adjacent to sidewalls 21 of the gate electrode structure 16. The first sidewall spacers 22 protect the gate electrode structure 16 during various FEOL processing techniques, and the first sidewall spacers 22 also provide a patterning function to selectively mask the well 14 in the underlying semiconductor substrate 10 during ion implantation for source and drain extension region formation. In an embodiment and as shown in FIG. 1, a first spacer-forming material is deposited over the gate electrode structure 16 and the semiconductor substrate 10 to form a first spacer layer 23. In an embodiment, the first spacer-forming material includes a nitride. Examples of suitable nitrides for the first spacer-forming material include silicon nitrides. Referring to FIG. 2, the first spacer layer is anisotropically etched with a first spacer etchant 30, which may be a nitride etchant, thereby removing the first spacer-forming material from horizontal surfaces to complete formation of the first sidewall spacers 22. In embodiments, the first spacer-forming material is dry etched from the horizontal surfaces using the first spacer etchant 30. Dry etching is also referred to in the art as a plasma etching technique. Various dry etching techniques using the first spacer etchant 30 that includes the nitride etchant result in oxidation of a surface of the semiconductor substrate 10 during etching, thereby forming a thin oxide layer 24 on the semiconductor substrate 10 after etching. In particular, material at the surface of the semiconductor substrate 10 is oxidized, thereby converting the material at the surface of the semiconductor substrate 10 to the thin oxide layer 24. For example, dry etching with a first spacer etchant 30 that includes $CF_4$ results in formation of the thin oxide layer 24. The thin oxide layer 24 is generally only formed to a depth of from about 1 to 2 nm within the semiconductor substrate 10.

Figure 3:
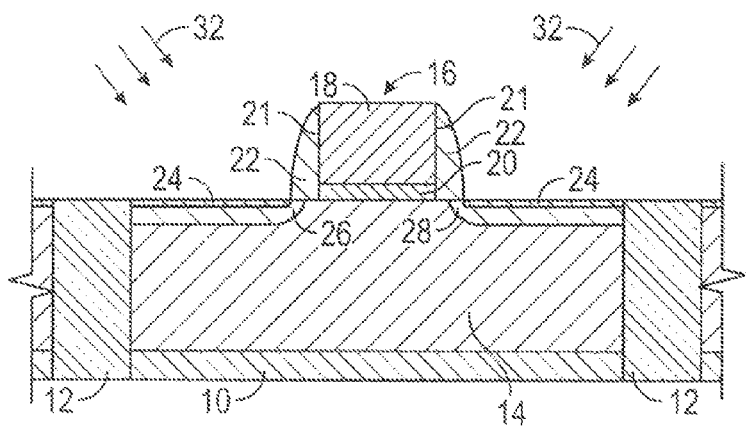

Referring to FIG. 3, after forming the first sidewall spacers 22, a source extension region 26 and a drain extension region 28 are formed in the semiconductor substrate 10 for the gate electrode structure 16. The source extension region 26 and the drain extension region 28 may be formed through conventional ion implantation techniques whereby conductivity determining ions 32 are implanted into the semiconductor substrate 10. During ion implantation, the first sidewall spacers 22 selectively mask the semiconductor substrate 10 and protect the gate electrode structure 16. In the embodiment, P-type conductivity determining ions 32 are employed for the ion implantation and, in particular, formation of source extension region 26 and the drain extension region 28. Although not shown, other gate electrode structures (such as N-type gate electrode structures) may be masked during ion implantation. While formation of the source extension region 26 and the drain extension region 28 is shown in FIG. 3, it is to be appreciated that techniques for forming source extension regions and drain extension regions are dynamic and that the instant methods do not necessarily require that ions be implanted in any specific configuration.

Figure 4:
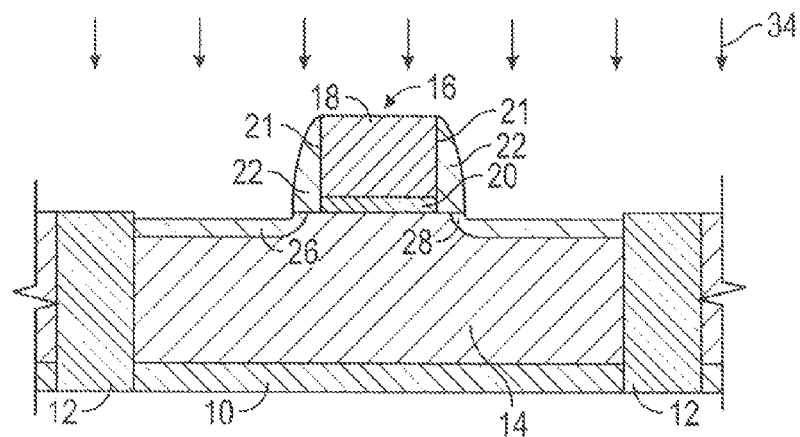

Referring to FIG. 4, an oxide etchant 34 is applied to the surface of the semiconductor substrate 10. The oxide etchant 34 is applied after formation of the first sidewall spacers 22, which may result in formation of the thin oxide layer as described above. As such, the oxide etchant 34 is more specifically applied to the thin oxide layer on the surface of the semiconductor substrate 10. Application of the oxide etchant 34 to the surface of the semiconductor substrate 10 is conducted separate from etching the first spacer layer. In particular, at least one process technique (e.g., source and drain extension region formation) is conducted between etching the first spacer layer and applying the oxide etchant 34 to the surface of the semiconductor substrate 10. The oxide etchant 34 effectively 10 etches the thin oxide layer on the surface of the semiconductor substrate 10 and prepares the surface of the semiconductor substrate 10 for formation of a second spacer layer over the semiconductor substrate 10 and the first sidewall spacers 22 with maximized adhesion, as described in further detail below. As such, the oxide etchant 34 is also generally applied after formation of the source extension region 26 and the drain extension region 28 to avoid reoxidation that may occur due to atmospheric exposure during long queue times between FEOL processing stages prior to forming the second spacer layer. In embodiments and although not shown, portions of the surface of the semiconductor substrate 10 that are adjacent to N-type gate electrodes may be masked while applying the oxide etchant 34 to other portions of the surface of the semiconductor substrate 10, such as the surface of the semiconductor substrate 10 adjacent to the p-type gate electrode structure 16. In embodiments, the oxide etchant 34 includes HF and, more specifically, may include a diluted solution of HF in DI water. For example, the oxide etchant 34 may include from 1:100 dHF to 1:300 dHF, such as about 1:100 dHF. Optionally, additional wet etchants may be employed before application of the oxide etchant 34 to further assist with removing surface contaminants on the semiconductor substrate 10. Examples of additional wet etchants that may be employed, in addition to the oxide etchant 34, include Standard Clean 1 (SC1), Standard Clean 2 (SC2), or other peroxide based chemistries using a single wafer clean (SWC) tool, and such additional wet etchants are generally applied prior to the oxide etchant 34 because such additional wet etchants generally oxidize the surface of the semiconductor substrate 10. The thin oxide layer is thus removed by applying the oxide etchant 34 to the surface of the semiconductor substrate 10, optionally using the additional wet etchant prior to applying the oxide etchant 34, and material is generally removed from the surface of the semiconductor substrate 10 at least to a depth of the thin oxide layer. For example, the oxide etchant 34 may be applied to the surface of the semiconductor substrate 10 for a period of from about 5 to about 30 seconds under ambient temperature of about 21° C., which is sufficient to remove the thin oxide layer that has the thickness of less than or equal to about 3 microns. While FIG. 4 illustrates removal of the thin oxide layer and shows a recess where the thin oxide layer is removed, it is to be appreciated that the thin oxide layer is generally so thin that the actual recesses are much smaller than those shown in FIG. 4, although it further is to be appreciated that the figures are not drawn to scale.

Figure 5:
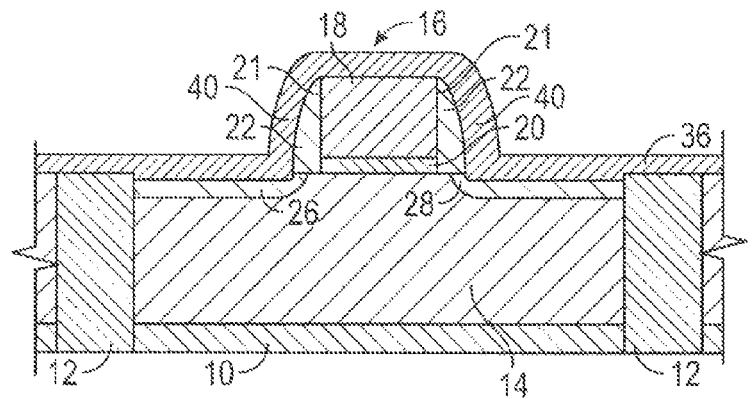

Referring to FIG. 5, after applying the oxide etchant to the surface of the semiconductor substrate 10, a second spacer material including a nitride is deposited over the semiconductor substrate 10 and the first sidewall spacers 22 to form a second spacer layer 36. The second spacer layer 36 may be formed through conventional techniques, such as molecular layer deposition. In embodiments, the second spacer material is deposited immediately after applying the oxide etchant to the surface of the semiconductor substrate 10 to minimize reoxidation of the surface of the semiconductor substrate 10 prior to deposition of the second spacer material. By "immediately after", it is meant that the second spacer material is deposited in the next processing stage after applying the oxide etchant. In embodiments, the second spacer material is deposited directly onto the semiconductor substrate 10 in the absence of an oxide disposed between the second spacer layer 36 and the semiconductor substrate 10. With the thin oxide layer effectively removed, adhesion is maximized between the semiconductor substrate 10 and the second spacer layer 36.

Figure 6:
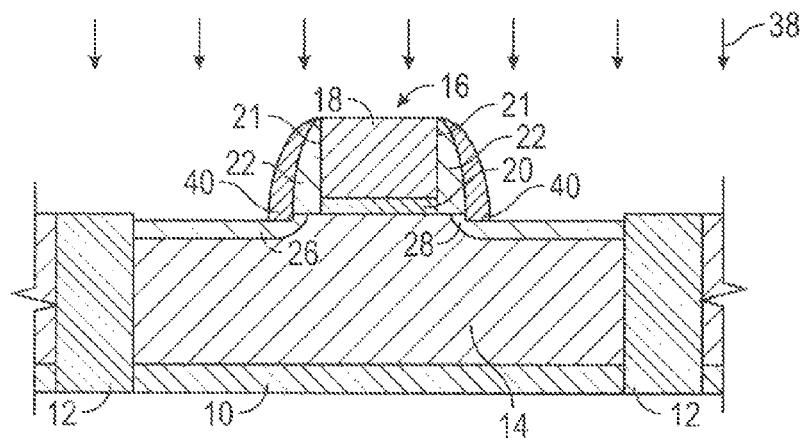

The second spacer layer 36 is employed to form second sidewall spacers 40 that further protect the gate electrode structure 16 during various FEOL processing techniques and that also provide a patterning function to selectively mask the well 14 in the underlying semiconductor substrate 10 during deep ion implantation for source and drain region formation. Suitable nitrides for the second spacer layer 36 include, but are not limited to, silicon nitride. Referring to FIG. 6, the second spacer layer is etched with a second spacer etchant 38, thereby removing the second spacer material from horizontal surfaces to complete formation of the second sidewall spacers 40. The second spacer etchant 38 may be a nitride etchant and may be the same as or different from the first spacer etchant. An example of a suitable second spacer etchant 38 includes, but is not limited to, phosphoric acid.

Figure 7:
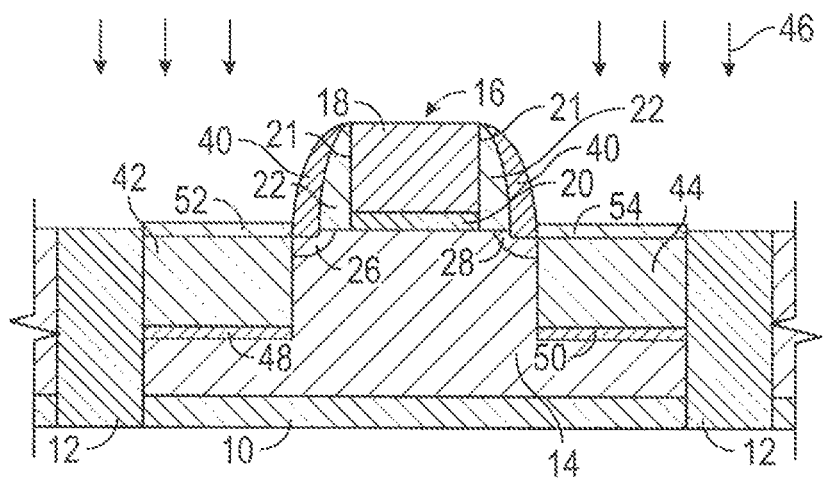

Referring to FIG. 7, after forming the second sidewall spacers 40, a source region 42 and a drain region 44 are formed in the semiconductor substrate 10 for the gate electrode structure 16. In an embodiment and as shown in FIG. 7, source and drain cavities are etched, followed by forming epitaxially-grown SiGe regions 48, 50. Intrinsic silicon caps 52, 54 are formed over the epitaxially-grown SiGe regions 48, 50, respectively. The epitaxially-grown SiGe regions 48, 50 and intrinsic silicon caps 52, 54 effectively replace material of the semiconductor substrate 10 and are considered part of the semiconductor substrate 10 for purposes of the disclosure herein. The source region 42 and the drain region 44 are then formed through high dose ion implantation of appropriate ions 46 into the epitaxially-grown SiGe regions 48, 50 and respective intrinsic silicon caps 52, 54, thereby forming the source region 42 and the drain region 44 in the semiconductor substrate 10. Appropriate ions 46 are determined based on the whether P-type or N-type devices are formed. The source region 42 and the drain region 44 are deeper than the source extension region 26 and the drain extension region 28, which facilitates later formation of contacts to those regions. The source region 42 and the drain region 44 are also spaced farther away from the gate electrode structure 16 than the source extension region 26 and the drain extension region 28. The second sidewall spacers 40 are employed to align the source region 42 and the drain region 44 relative to the gate electrode structure 16 with desired spacing therefrom. Although not shown, conventional masking techniques may be employed to shield areas on the semiconductor substrate 10 where ion implantation is not desired.

In embodiments and although not shown, after completing ion implantation, a silicide layer may be formed in the source region 42 and drain region 44, and further structure may then be formed overlying the gate electrode structure 16, silicide layer, and semiconductor substrate 10 in accordance with conventional integrated circuit fabrication. For example, an interlayer dielectric may be formed through which a logical network of electrical interconnects may be formed to complete integrated circuit fabrication.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating an integrated circuit comprising:
   forming a gate electrode structure overlying a semiconductor substrate;
   forming first sidewall spacers adjacent to sidewalls of the gate electrode structure, wherein the first sidewall spacers comprise a nitride and wherein forming the first sidewall spacers comprises depositing a first spacer-forming material over the gate electrode structure and the semiconductor substrate to form a first spacer layer, and etching the first spacer layer with a first spacer etchant to form the sidewall spacers, wherein a surface of the semiconductor substrate is oxidized during etching to form a thin oxide layer thereon;
   applying an oxide etchant to a surface of the semiconductor substrate after forming the first sidewall spacers, wherein applying the oxide etchant to the surface of the semiconductor substrate is conducted separate from etching the first spacer layer;
   depositing a second spacer material comprising a nitride over the semiconductor substrate and the first sidewall spacers to form a second spacer layer after applying the oxide etchant to the surface of the semiconductor substrate; and
   etching the second spacer layer with a second spacer etchant to form second sidewall spacers.

2. The method of claim 1, wherein etching the first spacer layer with the first spacer etchant comprises etching the first spacer layer through a dry etching technique to form the first sidewall spacers.

3. The method of claim 2, wherein etching the first spacer layer comprises dry etching the first spacer layer with the first spacer etchant comprising $CF_4$.

4. The method of claim 3, wherein etching the first spacer layer with the first spacer etchant comprising CF4 produces the thin oxide layer on the surface of the semiconductor substrate, and wherein applying the oxide etchant to the surface of the semiconductor substrate comprises etching the thin oxide layer with the oxide etchant.

5. The method of claim 1, wherein applying the oxide etchant to the surface of the semiconductor substrate comprises applying the oxide etchant comprising HF to the surface of the semiconductor substrate.

6. The method of claim 5, wherein the oxide etchant further comprises DI water, and wherein applying the oxide etchant comprises applying the oxide etchant comprising HF and DI water to the surface of the semiconductor substrate.

7. The method of claim 6, wherein applying the oxide etchant to the surface of the semiconductor substrate comprises applying the oxide etchant for a period of from about 5 to about 30 seconds.

8. The method of claim 1, wherein depositing the second spacer material over the semiconductor substrate and the first sidewall spacers comprises depositing the second spacer material immediately after applying the oxide etchant to the surface of the semiconductor substrate.

9. The method of claim 8, wherein depositing the second spacer material over the semiconductor substrate and the first sidewall spacers comprises depositing the second spacer material directly onto the semiconductor substrate in the absence of oxide disposed between the second spacer layer and the semiconductor substrate.

10. The method of claim 1, further comprising forming a source extension region and a drain extension region in the semiconductor substrate for the gate electrode structure after forming the first sidewall spacers and prior to depositing the second spacer material over the semiconductor substrate and the first sidewall spacers.

11. The method of claim 10, wherein applying the oxide etchant to the surface of the semiconductor substrate comprises applying the oxide etchant after forming the source extension region and the drain extension region.

12. The method of claim 10, further comprising forming a source region and a drain region in the semiconductor substrate for the gate electrode structure after forming the second sidewall spacers.

13. The method of claim 1, wherein the gate electrode structure is further defined as a gate electrode structure for a P-type device, and wherein applying the oxide etchant comprises applying the oxide etchant to the surface of the semiconductor substrate adjacent to the gate electrode structure for the P-type device.

14. The method of claim 1, wherein forming the gate electrode structure comprises depositing a high-k dielectric material over the semiconductor substrate to form a high-k dielectric layer.

15. The method of claim 14, wherein forming the gate electrode structure further comprises depositing a gate material over the high-k dielectric layer to form a gate semiconductor layer overlying the high-k dielectric layer.

16. The method of claim 15, wherein forming the gate electrode structure further comprises patterning the gate semiconductor layer and the high-k dielectric layer to form the gate electrode structure.

17. A method for fabricating an integrated circuit comprising:

forming a gate electrode structure overlying a semiconductor substrate;

depositing a first spacer-forming material over the gate electrode structure and the semiconductor substrate to form a first spacer layer;

etching the first spacer layer with a first spacer etchant through a dry etching technique to form first sidewall spacers, wherein a surface of the semiconductor substrate is oxidized during etching to form a thin oxide layer thereon;

removing the thin oxide layer from the surface of the semiconductor substrate after forming the first sidewall spacers;

depositing a second spacer material comprising a nitride over the semiconductor substrate and the first sidewall spacers to form a second spacer layer after removing the thin oxide layer from the surface of the semiconductor substrate; and etching the second spacer layer with a second spacer etchant to form second sidewall spacers.

18. The method of claim 17, wherein the thin oxide layer is formed to a depth of from about 1 to 2 nm within the semiconductor substrate, and wherein removing the thin oxide layer comprises removing material from the surface of the semiconductor substrate at least to the depth of the thin oxide layer.

* * * * *